(12) United States Patent
Kanegae et al.

(10) Patent No.: US 8,084,826 B2
(45) Date of Patent: Dec. 27, 2011

(54) SEMICONDUCTOR DEVICE AND MANUFACTURING METHOD THEREOF

(75) Inventors: Kenshi Kanegae, Osaka (JP); Masaru Yamada, Toyama (JP)

(73) Assignee: Panasonic Corporation, Osaka (JP)

( * ) Notice: Subject to any disclaimer, the term of this patent is extended or adjusted under 35 U.S.C. 154(b) by 268 days.

(21) Appl. No.: 12/364,797

(22) Filed: Feb. 3, 2009

(65) Prior Publication Data

US 2009/0200615 A1 Aug. 13, 2009

(30) Foreign Application Priority Data

Feb. 13, 2008 (JP) ................... 2008-031393

(51) Int. Cl.
*H01L 21/66* (2006.01)
*H01L 21/76* (2006.01)

(52) U.S. Cl. . 257/369; 257/199; 257/374; 257/E21.576; 257/E21.633; 257/E21.635

(58) Field of Classification Search ........... 257/E29.266; 438/299
See application file for complete search history.

(56) References Cited

U.S. PATENT DOCUMENTS

| | | | | |
|---|---|---|---|---|
| 6,573,172 B1 * | 6/2003 | En et al. | ......................... | 438/626 |
| 2005/0285187 A1 * | 12/2005 | Bryant et al. | ................. | 257/335 |
| 2006/0157795 A1 | 7/2006 | Chen et al. | | |
| 2006/0202278 A1 * | 9/2006 | Shima et al. | .................. | 257/369 |
| 2007/0296027 A1 | 12/2007 | Yang et al. | | |
| 2008/0064173 A1 * | 3/2008 | Hung | ........................... | 438/299 |

OTHER PUBLICATIONS

C. D. Sheraw et al., "Dual Stress Liner Enhancement in Hybrid Orientation Technology," (2-1), 2005 Symposium on VSLI Technology Digest of Technical Papers, pp. 12-13.

D.V. Singh et al., "Stress Memorization in High-Performance FDSOI Devices with Ultra-Thin Silicon Channels and 25nm Gate Lengths," IEDM 2005.

* cited by examiner

*Primary Examiner* — Zandra Smith
*Assistant Examiner* — Tsz Chiu
(74) *Attorney, Agent, or Firm* — McDermott Will & Emery LLP

(57) ABSTRACT

An element larger than silicon is ion-implanted to a contact liner in an N-channel region to break constituent atoms of the contact liner in the N-channel region. An element larger than silicon is ion-implanted to the contact liner in a P-channel region to break constituent atoms of the contact liner, oxygen or the like is ion-implanted. Thereafter, heat treatment is performed to cause shrinkage of the contact liner in the N-channel region to form an n-channel contact liner, and to cause expansion of the contact liner in the P-channel region to form a p-channel contact liner.

20 Claims, 10 Drawing Sheets

→ Tr CAPABILITY IMPROVING COMPONENT
⇒ Tr CAPABILITY DEGRADING COMPONENT

→ Tr CAPABILITY IMPROVING COMPONENT
⇒ Tr CAPABILITY DEGRADING COMPONENT

→ Tr CAPABILITY IMPROVING COMPONENT
▷ Tr CAPABILITY DEGRADING COMPONENT

SEMICONDUCTOR DEVICE AND MANUFACTURING METHOD THEREOF

CROSS-REFERENCE TO RELATED APPLICATION

This application claims priority from Japanese Patent Application JP2008-031393 filed on Feb. 13, 2008, the disclosure of which application is hereby incorporated by reference into this application in its entirety for all purposes.

BACKGROUND OF THE INVENTION

The technology disclosed in the specification relates to a semiconductor device and a manufacturing method thereof. More particularly, the technology disclosed in the specification relates to a semiconductor device having a complementary field effect transistor formed by an n-channel field effect transistor and a p-channel field effect transistor.

With recent improvement of information communication equipments, demand for the processing capability of semiconductor devices such as LSI (Large Scale Integration) has been increasingly strict, and the operation speed of transistors has been increased in response to the demand. Especially a complementary field effect transistor formed by an n-channel field effect transistor and a p-type field effect transistor has been widely used because of its low power consumption. The operation speed of the complementary field effect transistor has been increased mainly by reducing the dimensions of the transistor structure, and such increase in operation speed has been supported by the progress in lithography technology for processing semiconductor elements.

In recent years, however, required minimum processing dimensions (minimum processing dimensions of the gate) have become smaller than the light wavelength level used in lithography, and further reduction in dimensions of the transistor structure is therefore difficult. It has been proposed to increase the transistor operation speed by increasing the mobility by distorting silicon of the channel portion. This method is based on the fact that the mobility (effective mass) of electrons changes when a silicon crystal is distorted.

For example, DSL (Dual Stress Liner) using contact liners and SMT (Stress Memorization Technology) have been introduced in D. V. Singh, et al., (20.5), IEDM 2005 as a stress application method for distorting silicon. In the SMT, high-temperature heat treatment is performed while applying a stress to a substrate, so that the stress remains on the substrate.

A complementary field effect transistor using DSL is studied in C. D. Sheraw et al., (2-1) VSLI 2005. C. D. Sheraw et al., (2-1) VSLI 2005 shows the crystal orientation, the stress direction to the channel, and change in characteristics of n-channel and p-channel transistors, and cross-sectional shapes of the transistors.

Regarding an n-channel transistor which has a silicon substrate having a (100) main surface and has a <110> channel direction, the mobility is improved by applying a tensile stress to the channel in the gate length direction and the gate width direction and applying a compressive stress to the channel in a direction perpendicular to the substrate surface. The mobility of a p-channel transistor having a <110> channel direction is improved by applying a compressive stress to the channel in the gate length direction and applying a tensile stress to the channel in the gate width direction.

Regarding an n-channel transistor which has a silicon substrate having a (100) main surface and has a <100> channel direction, the mobility is significantly improved by applying a tensile stress to the channel in the gate length direction, and the mobility is improved by applying a compressive stress to the channel in the gate width direction and in a direction perpendicular to the substrate surface. The mobility of a p-channel transistor having a <100> channel direction is somewhat improved by compressing the channel in the gate length direction. Note that the mobility of a complementary field effect transistor can be improved by applying a stress of the same direction to an n-channel transistor and a p-channel transistor when the complementary field effect transistor has a <110> channel direction.

Regarding a manufacturing method of a semiconductor device, it has been studied to independently form the respective channel directions of an n-channel transistor and a p-channel transistor of a complementary field effect transistor by using a lamination technology. In this case, it is effective to use an n-channel transistor having a <100> channel direction and a p-channel transistor having a <110> channel direction.

FIG. 9 shows a process flow of a conventional DSL technology. This process flow shows the steps from element isolation formation to contact liner formation.

In the conventional DSL technology of FIG. 9, element isolation is first formed by STI (Shallow Trench Isolation), and ion implantation for well formation is then performed in an n-channel transistor formation region (hereinafter, referred to as "N-channel region") and a p-channel transistor formation region (hereinafter, referred to as "P-channel region").

Next, threshold voltage (Vt) implantation is performed in each transistor formation region in order to determine a transistor threshold value. A gate insulating film is then formed over a substrate, and polysilicon as a gate electrode material is deposited over the gate insulating film. A dopant is then implanted to the gate electrode material on the N-channel region and the P-channel region, and a resist gate pattern is formed by lithography. By using the resist gate pattern as a mask, the polysilicon is etched to form polysilicon gate electrodes.

Extension implantation is then performed in each transistor formation region to form an extension region on both sides of the gate electrode. A layered film of an oxide film and a nitride film is then deposited over the whole substrate surface, and etch-back is performed to form a sidewall. N-type impurity ions and P-type impurity ions are then implanted to the N-channel region and the P-channel region, respectively. Heat treatment is performed to activate the dopants, whereby source/drain regions are formed. Silicide of nickel, that is, silicide of a high melting point metal, is then formed by a known method over the gate electrodes and the active regions.

After the sidewall is removed by etching, a plasma nitride film is deposited over the whole substrate surface. Heat treatment is then performed to cause film shrinkage, whereby a contact liner of the N-channel region is formed. An oxide film is then deposited over the whole substrate surface as a film serving both as an etching stopper film and a resist interface layer. A resist mask having an opening in the P-channel region is then formed by lithography. The plasma nitride film on the P-channel region is removed by etching by using the resist mask. The resist mask is then removed and a plasma nitride film is deposited over the whole substrate surface as a contact liner of the P-channel region. An oxide film is then deposited over the whole substrate surface as a resist interface layer. A resist mask having an opening in the N-channel region is then formed by lithography. The plasma nitride film on the N-channel region is removed by etching by using the underlying oxide film as an etching stopper. The resist mask is then removed and a contact formation interlayer film is formed by a known method. Contact holes are then formed.

FIG. 10A is a cross-sectional view in the gate length direction of a semiconductor device formed by the above process.

As shown in FIG. 10A, an n-channel gate 1203 and a p-channel gate 1204 are respectively formed in an N-channel region 1201 and a P-channel region 1202 in the conventional semiconductor device. A sidewall underlying film 1205 is formed on the respective sidewalls of the n-channel gate 1203 and the p-channel gate 1204. An element isolation region 1206 isolates the N-channel region 1201 and the P-channel region 1202 of the substrate from each other.

Source/drain regions 1207 containing N-type impurities are formed in an upper part of the substrate in the N-channel region 1201, and source/drain regions 1207 containing P-type impurities are formed in an upper part of the substrate in the P-channel region 1202. A silicide layer 1209 is formed on the source/drain regions 1207. A silicide layer 1208 is formed on the n-channel gate 1203 and the p-channel gate 1204.

A contact liner 1210 is formed over the substrate, the sidewall underlying film 1205, and the silicide layer 1208 in the N-channel region 1201. A contact liner 1212 is formed over the substrate, the sidewall underlying film 1205, and the silicide layer 1208 in the P-channel region 1202. An interlayer insulating film 1219 is formed over each contact liner. Contacts 1221 are also formed so as to extend through the interlayer insulating film 1219 to the respective silicide layers 1209. A resist interface layer 1211 is formed between the contact liner 1210 of the N-channel region 1201 and the interlayer insulating film 1219. A resist interface layer 1213 is formed between the contact liner 1212 of the P-channel region 1202 and the interlayer insulating film 1219.

In the conventional semiconductor device, a tensile stress can be applied in the gate length direction to the channel of a MOS (Metal Oxide Semiconductor) transistor formed in the N-channel region 1201 by the contact liner 1210 formed by film shrinkage. The mobility of the N-channel MOS transistor can thus be improved. The mobility of a P-channel MOS transistor, on the other hand, can be improved by applying a compressive stress to the channel of the P-channel MOS transistor.

By using the transistors which are subjected to a stress by the contact liner, transistor characteristics can be improved and the transistor gate width (the width in the direction parallel to the substrate surface and perpendicular to the channel direction) can be reduced, thereby enabling reduction in chip size. Moreover, since the transistor characteristics are improved, the transistor operation speed can be increased.

SUMMARY OF THE INVENTION

In the DSL process using a contact liner, however, the contact liners need to be formed separately in the N-channel region 1201 and the P-channel region 1202. It is therefore necessary to deposit a contact liner a plurality of times and to remove the contact liner a plurality of times. Accordingly, the contact liners need to overlap each other in an np boundary region 1214 located at the boundary between the N-channel region 1201 and the P-channel region 1202, and therefore a larger boundary width is required. With recent reduction in dimensions, however, the area of the np boundary region 1214 has been becoming increasingly important. The area problem of the np boundary region is especially significant in an SRAM (Static Random Access Memory) because the np boundary region occupies a large area in the SRAM. Even in a DRAM (Dynamic Random Access Memory) and a logic LSI, n channel regions and p-channel regions are alternately formed, and increase in area of the np boundary region has hindered reduction in chip size and increase in yield.

In the conventional semiconductor device of FIG. 10A, the contact liners 1210, 1212 overlap each other by an overlap width 1215 over the np boundary region 1214. An np boundary stepped portion 1216 is therefore formed between the contact liners 1210, 1212. Accordingly, a large amount of contact liner is etched to form a gate contact in the np boundary region 1214. When contact holes are formed above the source/drain regions simultaneously with the gate contacts, the contact holes may extend into the silicide layer formed on the source/drain regions.

In the case where the overlap width 1215 is set to a negative value in order to avoid such a problem, a slit 1218 is formed between the contact liners 1210, 1212 as shown in FIG. 10B. In this case, since the slit 1218 is always present in the np boundary region 1214, it is difficult to embed the interlayer insulating film 1219 and a void 1220 is formed in the interlayer insulating film 1219. The slit 1218 can be continuously present on the gate electrode sidewall and the gate. If the void 1220 is formed, a metal such as tungsten (W) as a contact material may enter the void 1220, causing short-circuit.

The present invention is made to solve the above problems, and it is an object of the present invention to provide a semiconductor device capable of controlling a stress to be applied to a channel in an N-channel region and a channel in a P-channel region and capable of suppressing increase in area and reduction in yield, and a manufacturing method of such a semiconductor device.

In order to achieve the above object, a semiconductor device according to the present invention includes: a semiconductor substrate; an element isolation region for electrically isolating a first active region in an N-channel region from a second active region in a P-channel region in the semiconductor substrate; an n-type field effect transistor having an n-channel gate formed on the first active region with a gate insulating film interposed therebetween and a first source/drain region formed on both sides of the n-channel gate in the first active region; a p-channel field effect transistor having a p-channel gate formed on the second active region with a gate insulating film interposed therebetween and a second source/drain region formed on both sides of the p-channel gate in the second active region; an n-channel contact liner formed over the first active region and side surfaces and a top surface of the n-channel gate and having a shrinkage force; and a p-channel contact liner formed over the second active region and side surfaces and a top surface of the p-channel gate, formed continuously with the n-channel contact liner so as to have a larger thickness than that of the n-channel contact liner, and having an expansion force.

In this structure, the n-channel contact liner has a shrinkage force and the p-channel contact liner has an expansion force. Accordingly, the channel of the n-channel field effect transistor is subjected to a tensile stress in the gate length direction and the channel of the p-channel field effect transistor is subjected to a compressive force in the gate length direction. The channel mobility can therefore be improved in both the n-channel field effect transistor and the p-channel field effect transistor without using a special material. Especially, since the n-channel contact liner and the p-channel contact liner are formed continuously with each other, the difference in level between the n-channel contact liner and the p-channel contact liner in the np boundary region can be reduced as compared to the conventional semiconductor device, whereby generation of voids can be suppressed. The semiconductor device of the present invention is therefore less likely to have problems such as short-circuit between wirings or between contacts, whereby the yield is improved. Moreover, the yield is not reduced even by forming the contact in the np boundary region, and the width of the np boundary region can be significantly reduced than in the conventional example. As a result, increase in chip area can be suppressed and the degree of freedom in design can be improved.

A method for manufacturing a semiconductor device includes the steps of: (a) forming a first active region in an N-channel region of a semiconductor substrate, forming a second active region in a P-channel region of the semiconductor substrate, and forming an element isolation region for electrically isolating the first active region from the second active region; (b) forming on the first active region an n-channel field effect transistor having a first gate insulating film, an n-channel gate, and a first source/drain region and forming on the second active region a p-channel field effect transistor having a second gate insulating film, a p-channel gate, and a second source/drain region; (c) forming an insulating film over the first active region and the n-channel field effect transistor and over the second active region and the p-channel field effect transistor; (d) by using a first mask covering the second active region and having an opening in the first active region, implanting ions of an element having an ionic radius equal to or larger than that of silicon to the insulating film in the N-channel region; (e) by using a second mask covering the first active region and having an opening in the second active region, implanting ions of an element having an ionic radius equal to or larger than that of silicon to the insulating film in the P-channel region; (f) after the step (e), implanting ions of an element having a higher bonding energy with constituent atoms of the insulating film than that between the constituent atoms to the insulating film in the P-channel region by using the second mask; and (g) after the steps (d) and (f), performing heat treatment to cause shrinkage of the insulating film in the N-channel region and thus to change the insulating film in the N-channel region into an n-channel contact liner, and performing heat treatment to cause expansion of the insulating film in the P-channel region and thus to change the insulating film in the P-channel region into a p-channel contact liner.

According to this method, ions of an element having an ionic radius equal to or larger than that of silicon are implanted to the insulating film in the N-channel region in the step (d) to break bonds between the constituent atoms of the insulating film. Since the heat treatment is performed after the bonds between the constituent atoms of the insulating film are broken, the constituent atoms re-bond with each other in a self-aligned manner so as to reduce the film potential, whereby shrinkage of the insulating film can be caused in the N-channel region. As a result, a tensile stress is applied to the channel of the n-channel field effect transistor in the gate length direction, whereby the mobility is improved. Regarding the insulating film in the P-channel region, on the other hand, the bonds between the constituent atoms of the insulating film are first broken in the step (e), and then ions of an element having a higher bonding energy with constituent atoms of the insulating film than that between the constituent atoms are implanted to the insulating film in the P-channel region in the step (f). Therefore, expansion of the insulating film can be caused in the P-channel region. As a result, a compressive force is applied to the channel of the p-channel field effect transistor in the gate length direction, whereby the mobility is improved. Moreover, since the n-channel contact liner and the p-channel contact liner are formed integrally in the manufacturing process, defects such as voids and slits are less likely to be generated in the np boundary region, and the width of the np boundary region can be reduced.

Preferably, the insulating film is made of, for example, silicon nitride.

Although the heat treatment of the step (g) is not limited to a specific method, UV cure, for example, is preferable because the UV cure can be performed at a relatively low temperature and hydrogen and the like, if any, can be effectively removed from the film.

As has been described above, according to the manufacturing method of the semiconductor device of the present invention, the stress of the contact liner film can be adjusted for n-channel and p-channel after formation of the contact liner. Therefore, the contact liner can be made of one layer, and the contact liner has almost no difference in level in the np boundary region. Therefore, the possibility of increase in chip area and reduction in yield due to increase in the np boundary region is eliminated, and a high performance semiconductor device can be manufactured at low cost.

Moreover, ion implantation is performed to the contact liner after deposition of the contact liner, and the stress can be increased or reduced by causing shrinkage and expansion of the contact liner. Therefore, the stress to be applied to the channel can be appropriately adjusted according to the transistor type.

Moreover, there is no overlap of contact liners in the np boundary region. Accordingly, in the case where a silicide layer is formed under the contact liner, the silicide layer is less likely to be damaged in the step of etching the contact liner to form a contact. As a result, increase in silicide resistance is suppressed, whereby a semiconductor device manufactured by the method of the present invention is less likely to suffer from problems such as degradation in transistor characteristics and reduction in yield due to increase in contact resistance and the like.

BRIEF DESCRIPTION OF THE DRAWINGS

FIGS. 5A, 5B, and 5C are cross-sectional views showing the method for manufacturing a semiconductor device according to the embodiment of the present invention, wherein FIG. 5B is a cross-sectional view taken along line Vb-Vb in FIG. 6, and FIG. 5C is a cross-sectional view taken along line Vc-Vc in FIG. 6;

DETAILED DESCRIPTION OF THE PREFERRED EMBODIMENTS

Embodiment

Hereinafter, a method for manufacturing a semiconductor device according to an embodiment of the present invention will be described with reference to the figures.

Figure 1:
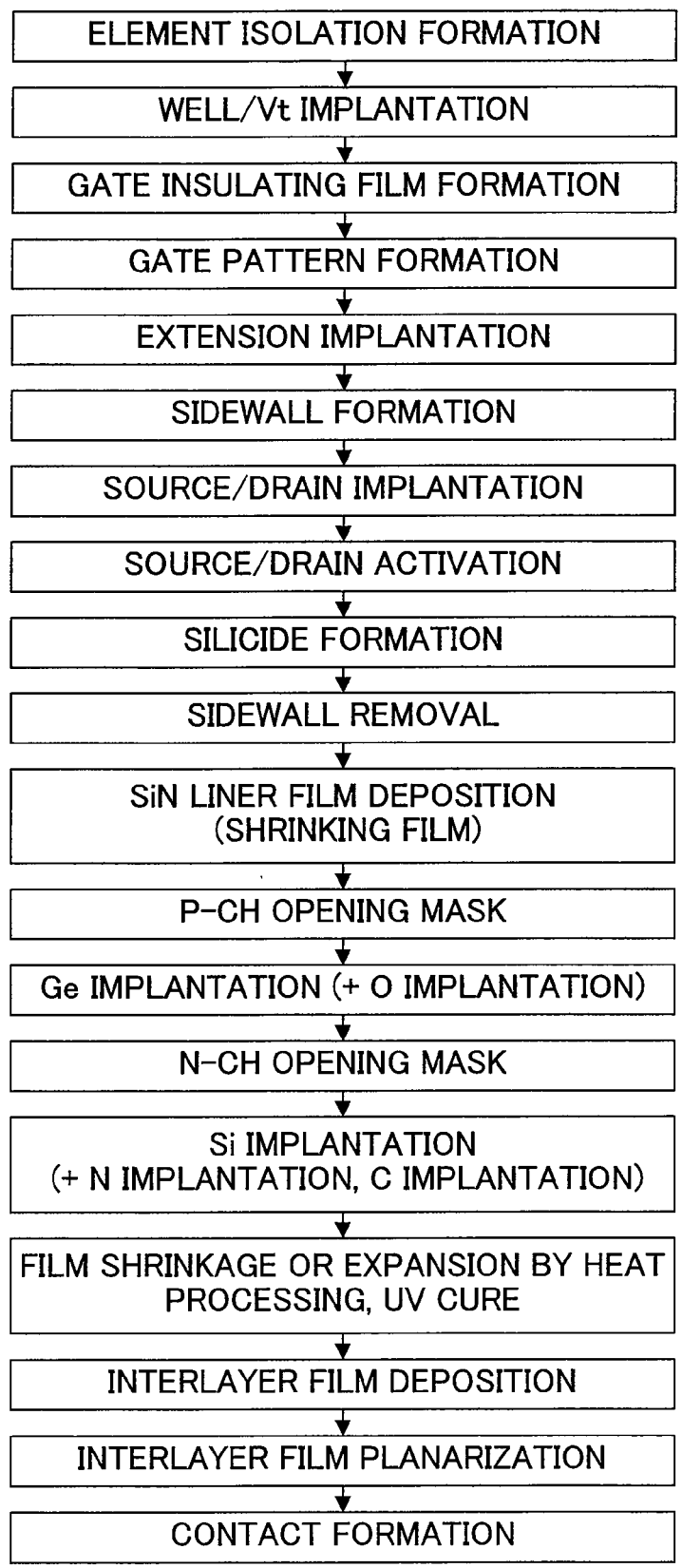
FIG. 1 shows a process flow in a method for manufacturing a semiconductor device according to an embodiment of the present invention.

FIG. 1 shows a process flow in the method for manufacturing a semiconductor device according to the embodiment of the present invention. FIGS. 2A through 2C, FIGS. 3A through 3C, FIGS. 4A through 4C, and FIGS. 5A through 5C are cross-sectional views showing the method for manufacturing a semiconductor device according to the embodiment of the present invention, and correspond to the process flow of FIG. 1. FIG. 6 is a plan view showing the semiconductor device of the embodiment in the state of FIGS. 5B and 5C. For easy understanding, n-channel gates 203 and p-channel gates 204 are shown by dotted line and sidewalls 505 and an interlayer insulating film 219 are not shown in FIG. 6.

Figure 2A:
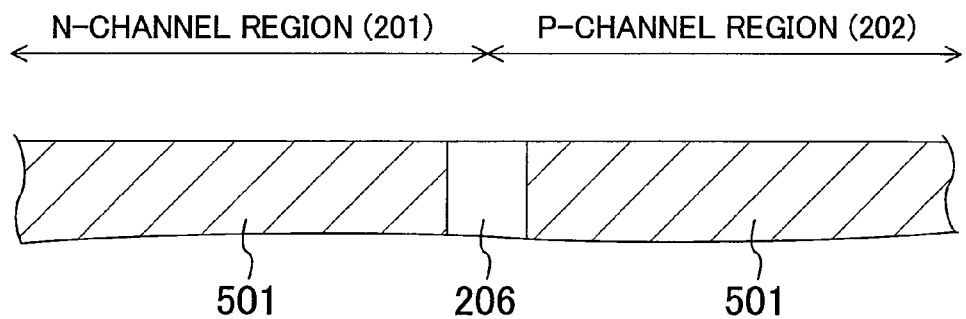
FIGS. 2A, 2B, and 2C are cross-sectional views showing the method for manufacturing a semiconductor device according to the embodiment of the present invention.

First, as shown in FIG. 2A, an element isolation region 206 is formed by STI (Shallow Trench Isolation) in a semiconductor substrate 501, and ion implantation for well formation is performed in an N-channel region 201 and a P-channel region 202 of the semiconductor substrate 501. Threshold voltage (Vt) implantation is then performed in the N-channel region 201 and the P-channel region 202 of the semiconductor substrate 501 to determine a threshold value of a MOS transistor.

Figure 2B:
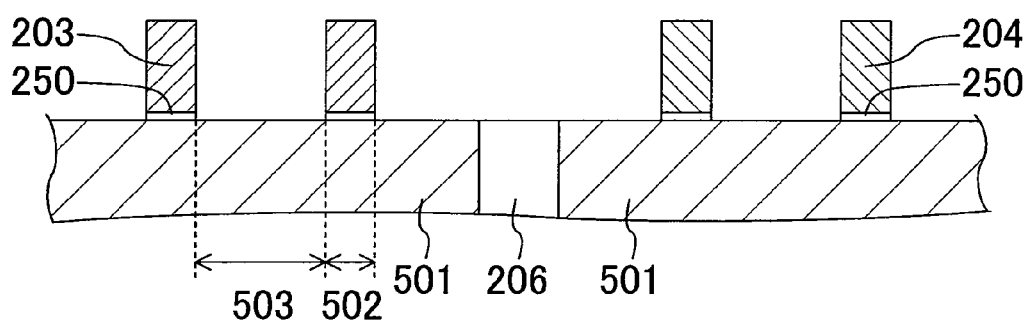

As shown in FIG. 2B, a gate insulating film 250 is then formed on the semiconductor substrate 501. The gate insulating film 250 has a thickness and a quality which are suitable for each transistor such as a logic transistor, an SRAM transistor, and an input/output (I/O) transistor. A polysilicon film having a thickness of about 100 nm to about 150 nm is then deposited on the gate insulating film 250. Phosphorus (P) ions are implanted as an n-type dopant to the polysilicon film in the N-channel region 201, and boron (B) ions are implanted as a p-type dopant into the polysilicon film in the P-channel region 202. A resist gate pattern is then formed by lithography. By using the resist gate pattern as a mask, the polysilicon film is etched to form polysilicon n-channel gates 203 and polysilicon p-channel gates 204. The n-channel gates 203 and the p-channel gates 204 have a gate length 502 of, for example, about 30 nm to about 65 nm, and the interval between the n-channel gates 203 and the interval between the p-channel gates 204 (gate interval 503) are as small as about 80 nm to about 200 nm.

Figure 2C:
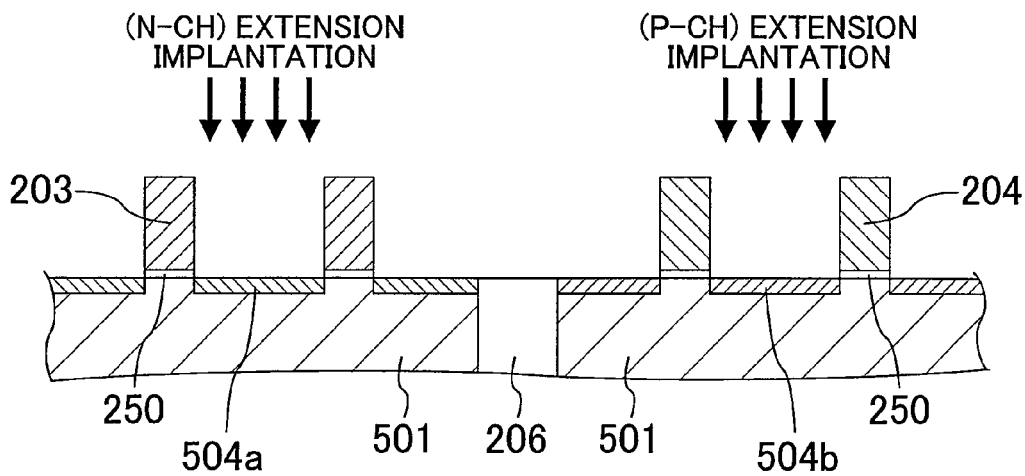

As shown in FIG. 2C, ion implantation is performed by using the n-channel gates 203 and the p-channel gates 204 as a mask to form extension regions 504a, 504b in the N-channel region 201 and the P-channel region 202, respectively. Although formation of an offset spacer is omitted herein, the extension regions 504a, 504b may be formed after the offset spacer is formed.

Figure 3A:
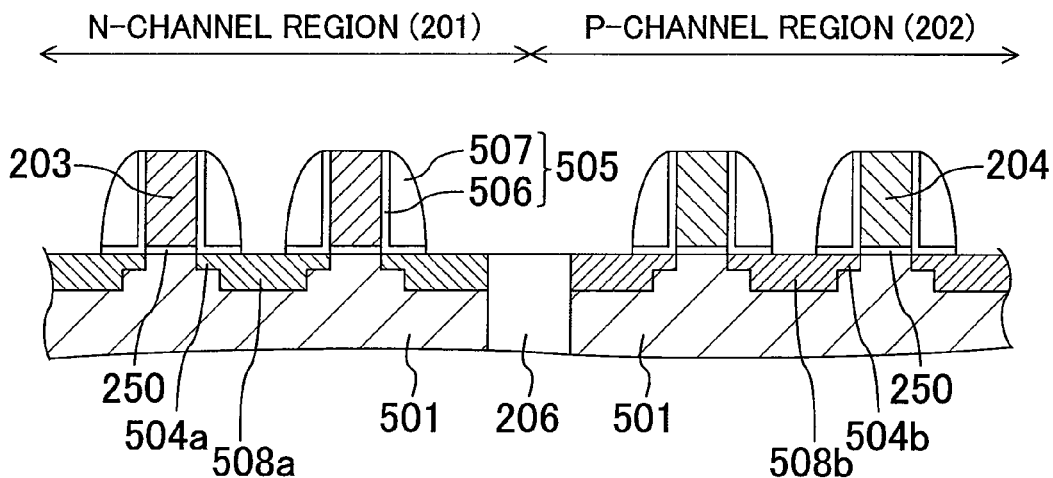
FIGS. 3A, 3B, and 3C are cross-sectional views showing the method for manufacturing a semiconductor device according to the embodiment of the present invention.

As shown in FIG. 3A, a sidewall lower layer film 506 and a sidewall 505 are then formed. First, a SA-NSG (Sub Atmospheric Pressure Non-doped Silicate Glass) film is deposited with a thickness of about 5 nm to about 10 nm over the whole surface of the semiconductor substrate 501 to form the sidewall lower layer film 506. A sidewall upper layer film 507 of an ALD-SiN (Atomic Layer Deposition-Silicon Nitride) film is then deposited with a thickness of about 20 nm to about 40 nm. The sidewall upper layer film 507 and the sidewall lower layer film 506 are then etched back to form a sidewall 505 on the side surfaces of the n-channel gates 203 and the p-channel gates 204. Arsenic (As) ions or phosphorus (P) ions are then implanted to an upper part of the semiconductor substrate 501 in the N-channel region 201, and boron (B) ions are implanted to an upper part of the semiconductor substrate 501 in the P-channel region 202. Heat treatment is then performed to activate the dopants, thereby forming source/drain regions 508a, 508b on both sides of each n-channel gate 203 and each p-channel gate 204.

Figure 3B:
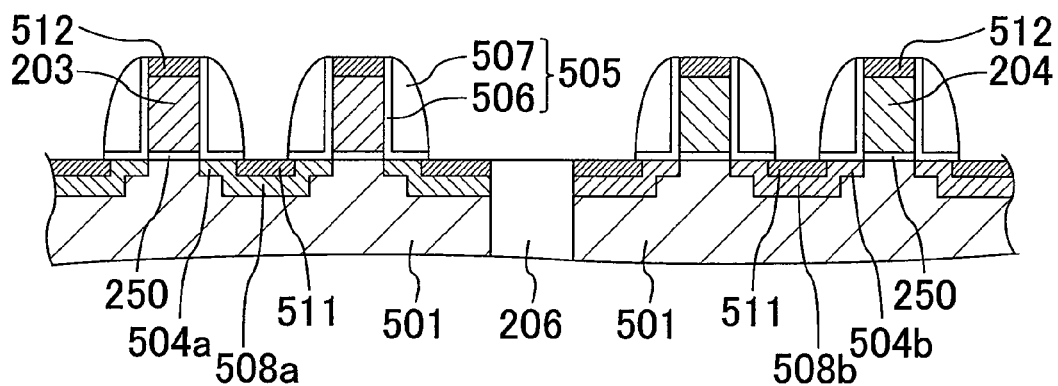

As shown in FIG. 3B, nickel (Ni) as a high melting point metal is then deposited by a sputtering method or the like over the whole substrate surface, and heat treatment is performed to silicidate Ni. A non-silicidated part of Ni is then removed by wet etching, whereby a Ni silicide layer 511 and a Ni silicide layer 512 are formed on the source/drain regions 508a, 508b in the upper part of the semiconductor substrate 501 and on the n-channel gates 203 and the p-channel gates 204. Note that other silicide metals such as cobalt (Co), titanium (Ti), tungsten (W), and platinum (Pt) may be used instead of Ni.

Figure 3C:
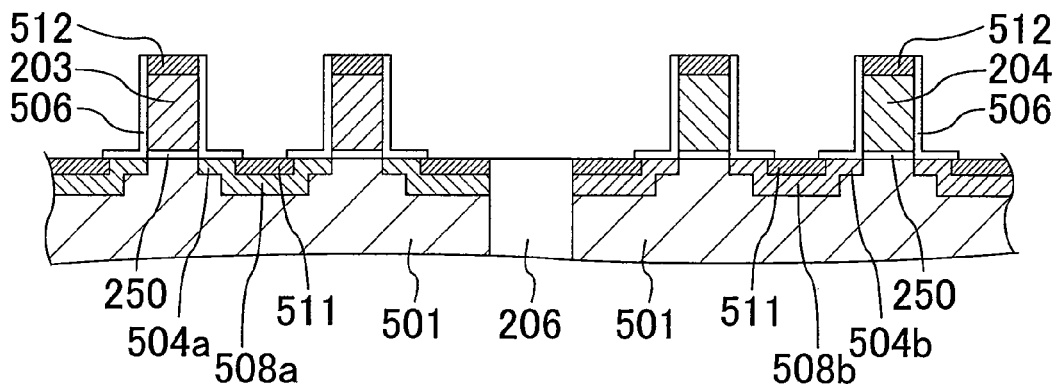

As shown in FIG. 3C, the sidewall upper layer film 507 of the sidewall 505 is then removed by etching to increase the interval between the n-channel gates 203 and the interval between the p-channel gates 204. This step is carried out in order to deposit a thick contact liner in a later step and thus increase a stress to be applied by the contact liner. Note that, in the description given herein, the sidewall upper layer film 507 is removed after silicide formation. However, the sidewall upper layer film 507 may alternatively be removed before silicide formation.

Figure 4A:
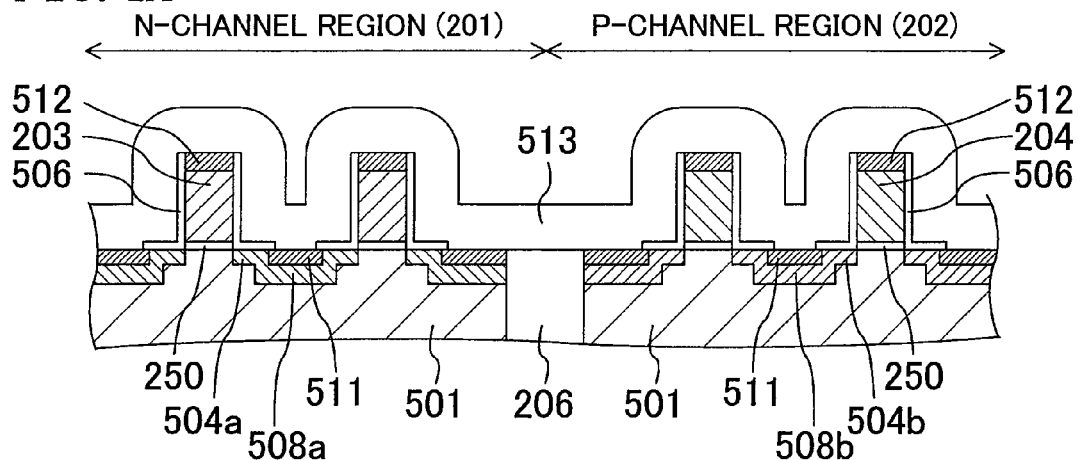
FIGS. 4A, 4B, and 4C are cross-sectional views showing the method for manufacturing a semiconductor device according to the embodiment of the present invention.

As shown in FIG. 4A, a contact liner 513 is then formed over the whole substrate surface in the N-channel region 201 and the P-channel region 202. More specifically, the contact liner 513 is formed by, for example, a plasma CVD (Chemical Vapor Deposition) method over the whole surface of the semiconductor substrate 501 including the source/drain regions 508a, 508b in the N-channel region 201 and the P-channel region 202, the sidewall lower layer film 506, and the Ni silicide layer 512. The contact liner 513 is made of, for example, a silicon nitride film. The thickness of the contact liner 513 is, for example, about 20 nm to about 60 nm. The film stress of the contact liner 513 depends on the film thickness and the film formation temperature of the contact liner 513. The film of the contact layer 513 is herein formed at a temperature of about 200° C. to about 350° C., and has an internal stress of about 0.1 GPa to about 0.5 GPa when film shrinkage is caused by heat treatment in a later step. Note that the material of the contact liner 513 is not limited to silicon nitride, and an insulating material such as silicon oxynitride (SiON) and silicon carbide (SiC) may be used as long as a film having the above internal stress can be formed.

Figure 4B:
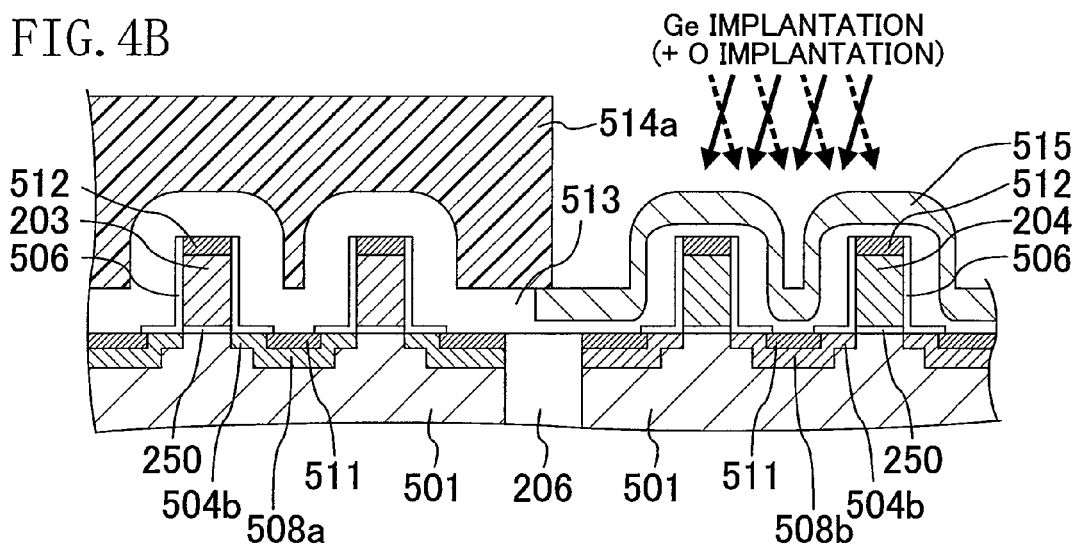

As shown in FIG. 4B, an implantation resist 514a is formed on the contact liner 513 in the N-channel region 201. The implantation resist 514a has an opening in the P-channel region 202. By using the implantation resist 514a as a mask, ion implantation is performed to the contact liner 513 in the P-channel region 202. In this step, germanium (Ge), which is an element having an ionic radius equal to or larger than that of silicon (Si), is ion-implanted from the top surface of the contact liner 513 to such a depth that does not reach the substrate at an acceleration energy of about 5 KeV to about 20 KeV and a dose of about $0.5 \times 10^{14}/cm^2$ to about $1 \times 10^{15}/cm^2$, thereby breaking Si—N bonds in the contact liner 513. The acceleration energy is adjusted so that Ge ions do not affect the Ni silicide layer 512 on the p-channel gates 204 and the source/drain regions 508b in the P-channel region 202.

With the implantation resist 514a left as it is, oxygen (O) ions for facilitating film expansion are implanted to such a depth that does not reach the substrate. More specifically, four-rotation ion implantation is performed at a tilt angle of about 0 degrees to about 7 degrees at an acceleration energy of about 0.5 KeV to about 10 KeV and a dose of $0.1 \times 10^{14}/cm^2$ to about $1 \times 10^{15}/cm^2$ to change an upper part of the contact liner 513 into a p-channel liner implantation layer 515. It is preferred to adjust the acceleration energy so that oxygen is not introduced into the Ni silicide layer 512 on the p-channel gates 204 and the source/drain regions 508b in the P-channel region 202. Since a margin is provided for oxygen implantation in this embodiment, oxygen is not introduced into a lower part of the contact liner 513 in the P-channel region 202, and the lower part of the contact liner 513 does not change into the p-channel liner implantation layer 515. After oxygen ions are implanted, the volume of the p-channel liner implantation layer 515 is somewhat larger than that of the original contact liner 513 even before thermal annealing. The implantation resist 514a is then removed. In this step, an element having a higher bond energy with constituent atoms (Si and N) of the contact liner 513 than that between the constituent atoms may be ion-implanted instead of oxygen.

Note that, instead of Ge, arsenic (As), indium (In), and the like may be used as an element having an ionic radius equal to or larger than that of Si. Si may be implanted. Since it is difficult to break Si—N bonds by an element having a smaller ionic radius than that of Si, it is preferable to implant an element having an ionic radius equal to or larger than that of Si.

Figure 4C:
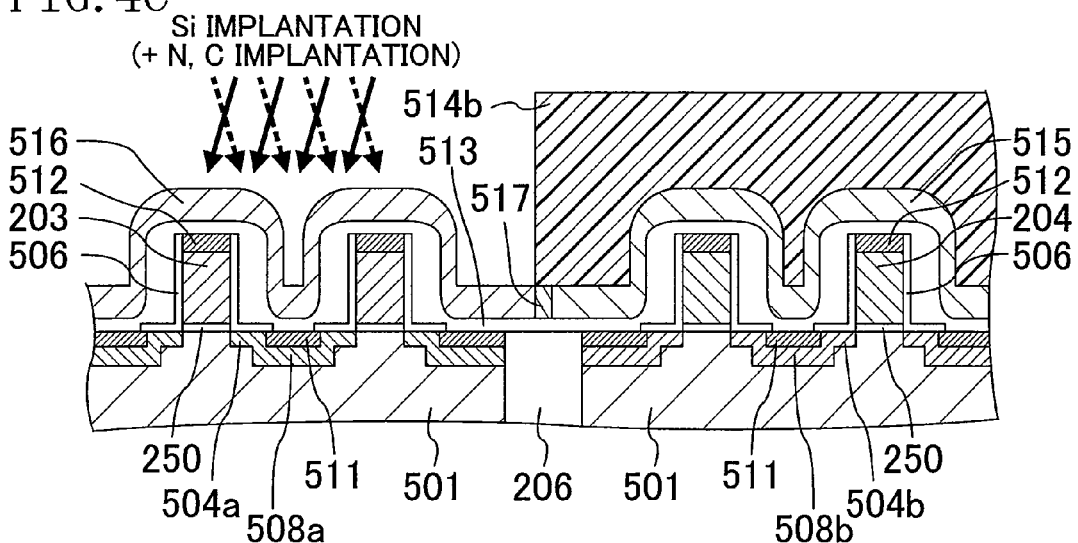

As shown in FIG. 4C, an implantation resist 514b is formed on the p-channel liner implantation layer 515 in the P-channel region 202. The implantation resist 514b has an opening in the N-channel region 201. By using the implantation resist 514b as a mask, ion implantation is performed to the contact liner 513 in the N-channel region 201. In this step, silicon (Si), which is an element having an ionic radius equal to or larger than that of Si, is ion-implanted from the top surface of the contact liner 513 to such a depth that does not reach the substrate. More specifically, four-rotation ion implantation is performed at a tilt angle of about 0 degrees to about 7 degrees at an acceleration energy of about 5 KeV to about 20 KeV and a dose of $0.5 \times 10^{14}/cm^2$ to about $5 \times 10^{14}/cm^2$ to break Si—N bonds in the contact liner 513. Carbon (C) for facilitating film shrinkage is then ion-implanted to such a depth that does not reach the substrate at an acceleration energy of about 0.5 KeV to about 5 KeV and a dose of about $0.1 \times 10^{14}/cm^2$ to about $5 \times 10^{14}/cm^2$, thereby changing an upper part of the contact liner 513 into an n-channel liner implantation layer 516. The implantation resist 514b is then removed. It is preferred to adjust the acceleration energy so that carbon is not introduced into the Ni silicide layer 512 on the n-channel gates 203 and the source/drain regions 508a in the N-channel region 201. Since a margin is provided for carbon implantation in this embodiment, carbon is not introduced into a lower part of the contact liner 513 in the N-channel region 201, and the lower part of the contact liner 513 does not change into the n-channel liner implantation layer 516.

Note that, instead of Si, arsenic (As), indium (In), germanium (Ge), and the like may be used as an element having an ionic radius equal to or larger than that of Si. Si—N bonds in the contact liner 513 can be broken by using As, In, Ge, and the like. The Si—N bonds may be broken by implanting $N_2$ solely or in combination with Si or the like.

Instead of carbon (C), fluorine (F) may be used as an implantation species for facilitating film shrinkage of the n-channel liner implantation layer 516.

Note that description has been given to an example in which a resist is formed directly on the surface of the contact liner 513. However, a thin oxide film having a thickness of about 5 nm to about 10 nm may be deposited on the contact liner 513 after the step of FIG. 4A. By using the thin oxide film as an interface layer with the implantation resists 514a, 514b, deactivation of the implantation resists 514a, 514b, and the like can be prevented, whereby defective pattern formation can be prevented.

After the step of FIG. 4C, an np boundary region 517 is formed at the boundary between the n-channel liner implantation layer 516 and the p-channel liner implantation layer 515. Since four-rotation ion implantation is performed at a tilt angle of about 0 degrees to about 7 degrees as implantation to the contact liner 513, the liner implantation layers slightly overlap each other. Implantation for breaking Si—N bonds is herein performed in the N-channel region 201 and the P-channel region 202 by using separate resist masks. However, ion implantation for breaking Si—N bonds may be performed simultaneously in the N-channel region 201 and the P-channel region 202, and an element such as carbon (C) and oxygen (O) may be implanted thereafter to the N-channel region 201 and the P-channel region 202 by using the resist masks 514a, 514b.

Figure 5A:
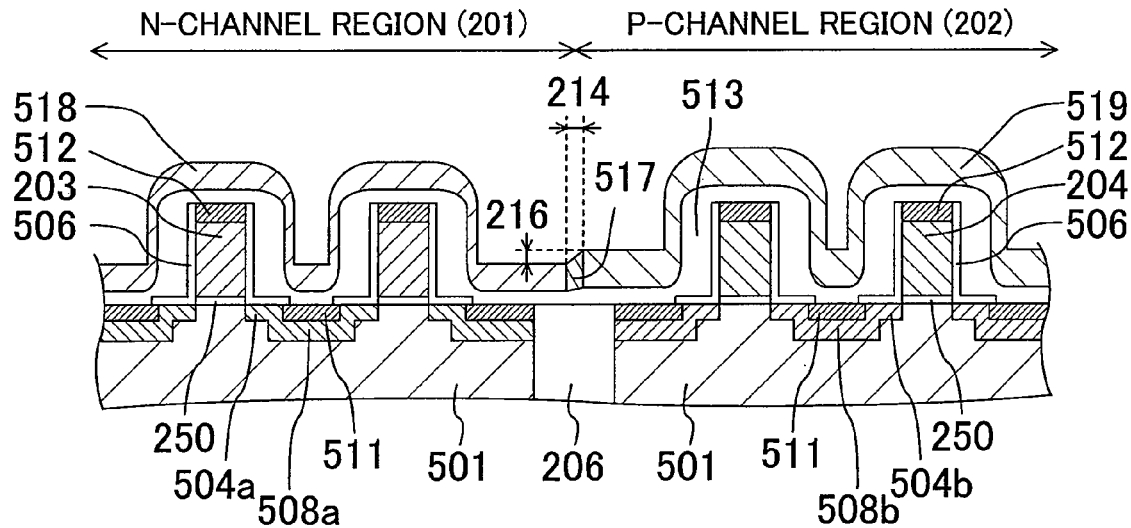
Figure 6:
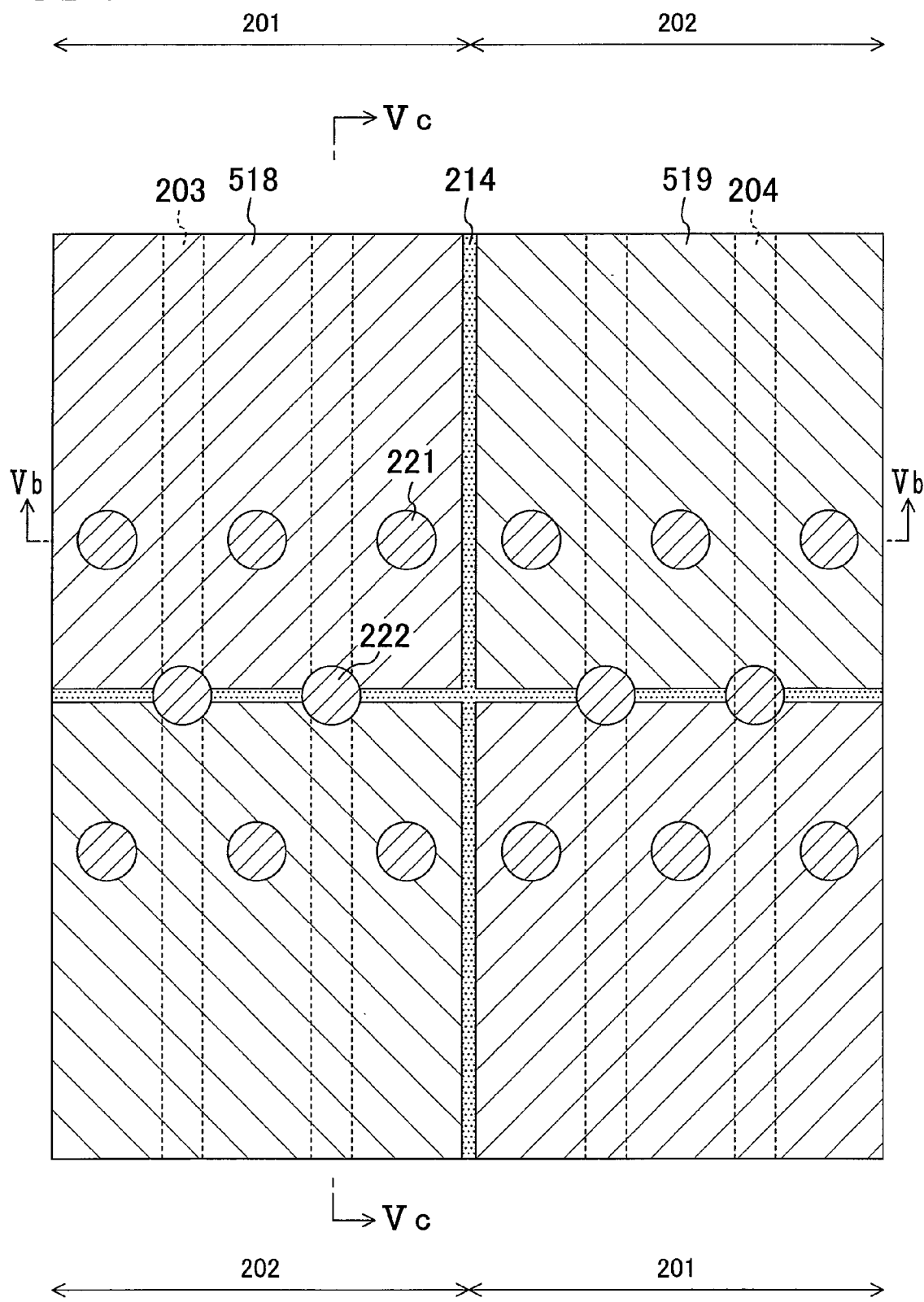
FIG. 6 is a plan view of a semiconductor device according to the embodiment of the present invention.

As shown in FIG. 5A, the broken Si—N bonds are re-formed by performing heat treatment such as UV (ultraviolet) cure, whereby the n-channel liner implantation layer 516 is changed into an n-channel contact liner 518 and the p-channel liner implantation layer 515 is changed into a p-channel contact liner 519. The UV cure is performed at a temperature equal to or higher than the film formation temperature of the contact liner 513. The UV cure facilitates reformation of the Si—N bonds and formation of Si—C bonds in the contact liner 513 in the N-channel region 201 and the n-channel liner implantation layer 516.

When Si re-bonds with nearby atoms in the UV cure, Si selects optimal bonding hands in a self-aligned manner, and the potential is kept small in order to reduce the internal stress of the film. The Si—N bonds or Si—C bonds can therefore be formed at a high density, whereby film shrinkage can further be facilitated. Especially when a plasma nitride film is used as the contact liner 513, Si—H bonds contained in the film are also broken by the ion implantation in addition to the Si—N bonds. Since hydrogen (H) ions broken simultaneously with the Si—N bonds are small and light-weight, the H ions are diffused outward toward the top surface of the contact liner (toward the top surface of the n-channel liner implantation layer 516) as the film shrinkage progresses in the heat treatment for re-bonding. As a result, the H-ion content of the n-channel contact liner 518 becomes lower than that before the UV cure. Note that such elimination of H ions occurs even if carbon or nitrogen is not introduced. Therefore, film shrinkage can be caused in the N-channel region 201 even by performing only ion implantation for breaking the Si—N bonds.

As has been described above, in this step, bonding hands of the Si atoms which had been terminated with Si—H bonds select optimal bonding hands. Therefore, a film having a high Si—N bond density is formed. Moreover, implanted carbon (C) forms Si—C bonds and facilitates film shrinkage by the Si—C bonds, whereby the film stress is further improved. As a result, a tensile stress is applied in the gate length direction and the gate width direction to the channel of the N-channel MOS transistor on the semiconductor substrate 501, and the mobility is improved.

In the contact liner 513 of the P-channel region 202 and the p-channel liner implantation layer 515, on the other hand, film expansion is facilitated by the Si—N re-bonding, Si—O—N bonds, and densely implanted Ge in the UV cure.

More specifically, when Si—N re-bonding is caused by the UV cure, Ge ions having a large ionic radius are present at a high density within the contact liner 513 and therefore the contact liner 513 expands in the P-channel region 202. Especially when a plasma nitride film is used as the contact liner 513, Si—H bonds contained in the film are also broken by the ion implantation in addition to the Si—N bonds. Since H ions broken simultaneously with the Si—N bonds are small and light-weight, the H ions are diffused outward toward the top surface of the contact liner (toward the top surface of the p-channel liner implantation layer 515) by the heat treatment for re-bonding. As a result, as in the n-channel contact liner 518, the H-ion content of the p-channel contact liner 519 becomes lower than that before the UV cure. Bonding hands of the Si atoms which had been terminated with Si—H bonds select optimal bonding hands. Due to the presence of oxygen (O) implanted into the contact liner 513, Si—N bonds having a lower bond energy are replaced with Si—O bonds having a higher bond energy, whereby Si—O bonds and Si—O—N bonds are formed. Film expansion is therefore facilitated in the p-channel contact liner 519 by the Si—O bonds. As a result, a compressive stress is applied in the gate length direction to the channel of the N-channel MOS transistor on the semiconductor substrate 501. The mobility is therefore improved regardless of whether the channel direction is a <110> direction or a <100> direction.

As described above, in the case where a plasma nitride film is used as the contact liner 513, the H-ion content of the contact liner 513 (the n-channel contact liner 518 and the p-channel contact liner 519 after the heat treatment) is reduced by performing the heat treatment such as UV cure. This reduces the possibility of phenomenon caused by H ions such as NBTI (Negative Bias Temperature Instability). NBTI is a phenomenon indicating degradation in reliability of the gate insulating film.

Near the corner of the bottom of the n-channel gates 203 and the p-channel gates 204, a seam is formed between the contact liner 513 formed on the semiconductor substrate 501 and the contact liner 513 formed on the side surface of each gate electrode upon formation of the contact liner 513. Therefore, cracks and the like may be generated in the n-channel contact liner 518 and the p-channel contact liner 519 when a large stress is applied. In the method of the present embodiment, however, the seam is eliminated by the ion implantation using an element larger than Si ions, whereby the contact liner 513 is continuously formed. Therefore, the possibility of crack generation is reduced.

Note that the n-channel contact liner 518 shrinks and the p-channel contact liner 519 expands by the heat treatment of this step. Therefore, a difference in level 216 is formed in the np boundary region 517. However, the expansion rate (volume expansion rate) and the shrinkage rate (volume shrinkage rate) are about 5% to about 15% and the difference in level 216 is about 3 nm to about 15 nm. The thickness of the n-channel contact liner 518 is about 15 nm to about 50 nm, and the thickness of the p-channel contact liner 519 is about 20 nm about 65 nm.

A width 214 in the gate length direction of the np boundary region 517 can be reduced to about 5 nm by improving the alignment accuracy of lithography and selecting an optimal resist boundary position. The width 214 of the np boundary region 517 can also be adjusted by the ion implantation angle to the contact liner 513.

The heat treatment of this step can be performed by using a heater, a lamp, or the like. However, the UV cure is the most preferable because hydrogen and the like in the film can be easily eliminated by the UV cure.

Figure 5B:
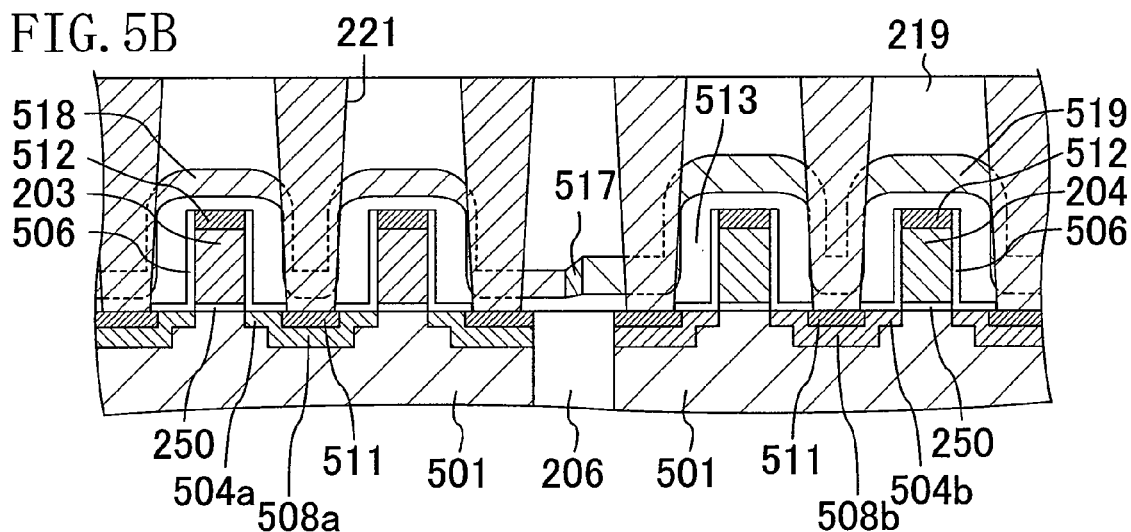
Figure 5C:
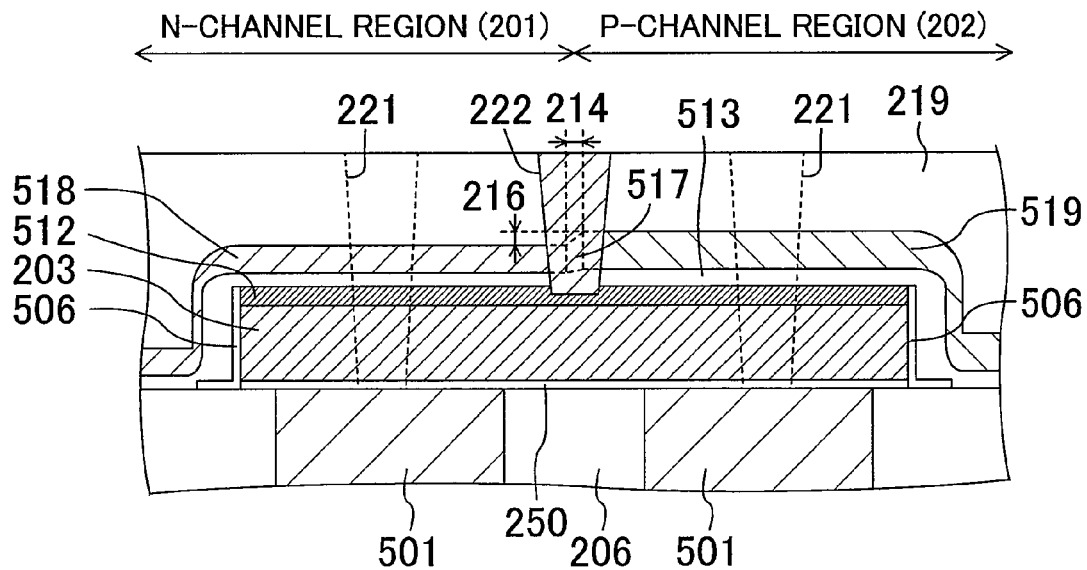

As shown in FIG. 5B, an interlayer insulating film 219 is then deposited over the substrate. The interlayer insulating film 219 thus deposited is planarized by CMP (Chemical Mechanical Polishing). Contacts 221 connecting to the source/drain regions 508a, 508b are then formed. At the same time, gate contacts 222 are formed as shown in FIG. 5C. FIG. 5C is a cross-sectional view of the semiconductor device in the gate width direction extending through the gate electrodes.

According to the manufacturing method of the present embodiment, the width of the np boundary region 517 and the difference in level 216 in the np boundary region 517 can be reduced as compared to the related art. Accordingly, the etching amount of the contact liner in the gate contact 222 on the np boundary region 517 does not significantly vary from that in the other region, and slits, voids and the like are not generated. Accordingly, the mobility is improved by appropriately distorting the channels of the MOS transistors without increasing the area, and the contacts can be formed with a high yield. Moreover, since the method of the present embodiment has less restriction on the formation region of the gate contacts 222, the degree of freedom in design can be improved. Moreover, the method of the present embodiment enables low-cost manufacturing of a semiconductor device having improved capability of both a p-channel transistor and an n-channel transistor.

As shown in FIGS. 5B and 5C and FIG. 6, the semiconductor device of the present embodiment manufactured by the above method includes the semiconductor substrate 501, the element isolation region 206, an n-channel field effect transistor, a p-channel field effect transistor, the n-channel contact liner 518, the p-channel contact liner 519, the interlayer insulating film 219, the contact 221, and the gate contact 222. The element isolation region 206 electrically isolates a region (first active region) located in the N-channel region 201 from a region (second active region) located in the P-channel region 202 in the semiconductor substrate 501. The n-channel field effect transistor is provided on the semiconductor substrate 501 in the N-channel region 201, and the p-channel field effect transistor is provided on the semiconductor substrate 501 in the P-channel region 201. The n-channel contact liner 518 is formed over the semiconductor substrate 501 and the n-channel field effect transistor in the N-channel region 201 and has a thickness of about 15 nm to about 50 nm. The p-channel contact liner 519 is formed over the semiconductor substrate 501 and the p-channel field effect transistor in the P-channel region 202 and has a thickness of about 20 nm to about 65 nm. The interlayer insulating film 219 is formed on the n-channel contact liner 518 and the p-channel contact liner 519. The contact 221 and the gate contact 222 extend through the interlayer insulating film 219, the n-channel contact liner 518, and the p-channel contact liner 519.

The n-channel field effect transistor has the gate insulating film 250, the n-channel gate 203, the L-shaped sidewall lower layer film 506, the extension region 504a, the source/drain region 508a, the Ni silicide layer 511, and the Ni silicide layer 512. The gate insulating film 250 is formed on the semiconductor substrate 501. The n-channel gate 203 is formed on the gate insulating film 250. The L-shaped sidewall lower layer film 506 is formed on both side surfaces of the n-channel gate 203 and over the semiconductor substrate 501. The extension region 504a is formed under the sidewall lower layer film 506 in the upper part of the semiconductor substrate 501 and contains n-type impurities. The source/drain region 508a is formed on both sides of the n-channel gate 203 in the semiconductor substrate 501. The source/drain region 508a is in contact with the extension region 504a and contains a higher concentration of n-type impurities than that in the extension region 504a. The Ni silicide layer 511 is formed on the source/drain region 508a and is connected to the contact 221. The Ni silicide layer 512 is formed on the n-channel gate 203 and is connected to the gate contact 222.

The n-channel contact liner 518 is formed over the Ni silicide layer 511 (or the source/drain region 508a or the first active region), the sidewall lower layer film 506, and the Ni silicide layer 512 in the N-channel region 201. The n-channel contact liner 518 contains impurities such as carbon (C) or fluorine (F), is made of silicon nitride as a base material, and has a shrinkage force. The channel region of the n-channel field effect transistor is therefore subjected to a tensile stress in the gate length direction and the gate width direction. Accordingly, the channel mobility of the n-channel field effect transistor is larger than that in the case where the n-channel field effect transistor is not subjected to the stress.

The p-channel field effect transistor has the gate insulating film 250, the p-channel gate 204, the L-shaped sidewall lower layer film 506, the extension region 504b, the source/drain region 508b, the Ni silicide layer 511, and the Ni silicide layer 512. The gate insulating film 250 is formed on the semiconductor substrate 501. The p-channel gate 204 is formed on the gate insulating film 250. The L-shaped sidewall lower layer film 506 is formed on both side surfaces of the p-channel gate 204 and over the semiconductor substrate 501. The extension region 504b is formed under the sidewall lower layer film 506 in the upper part of the semiconductor substrate 501 and contains p-type impurities. The source/drain region 508b is formed on both sides of the p-channel gate 204 in the semiconductor substrate 501. The source/drain region 508b is in contact with the extension region 504a and contains a higher concentration of p-type impurities than that in the extension region 504b. The Ni silicide layer 511 is formed on the source/drain region 508b and is connected to the contact 221. The Ni silicide layer 512 is formed on the p-channel gate 204 and is connected to the gate contact 222.

The p-channel contact liner 519 is formed over the Ni silicide layer 511 (or the source/drain region 508b or the second active region), the sidewall lower layer film 506, and the Ni silicide layer 512 in the P-channel region 202. The p-channel contact liner 519 contains impurities such as oxygen (O) or germanium (Ge), is made of silicon nitride as a base material, and has an expansion force. The channel region of the p-channel field effect transistor is therefore subjected to a compressive stress in the gate length direction and the gate width direction. Accordingly, the channel mobility of the p-channel field effect transistor is larger than that in the case where the p-channel field effect transistor is not subjected to the stress.

Figure 7A:
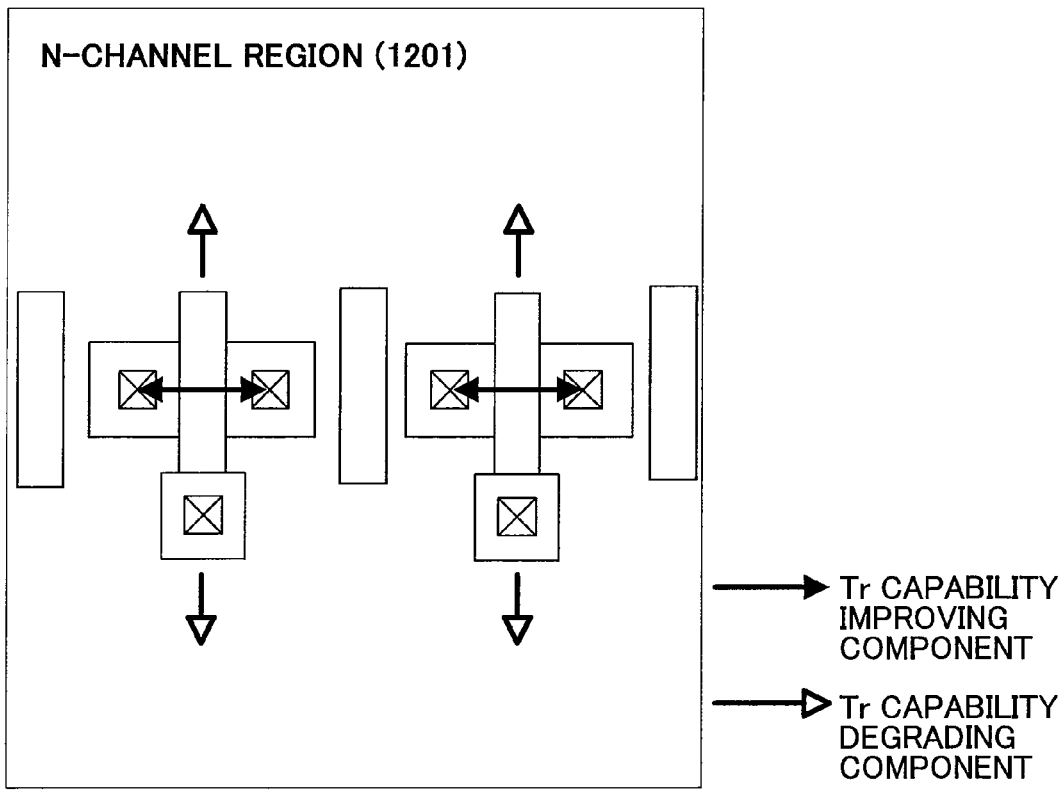
FIGS. 7A and 7B are plan views showing a layout example of an N-channel region in a conventional semiconductor device and the semiconductor device of the embodiment of the present invention, respectively.
Figure 7B:
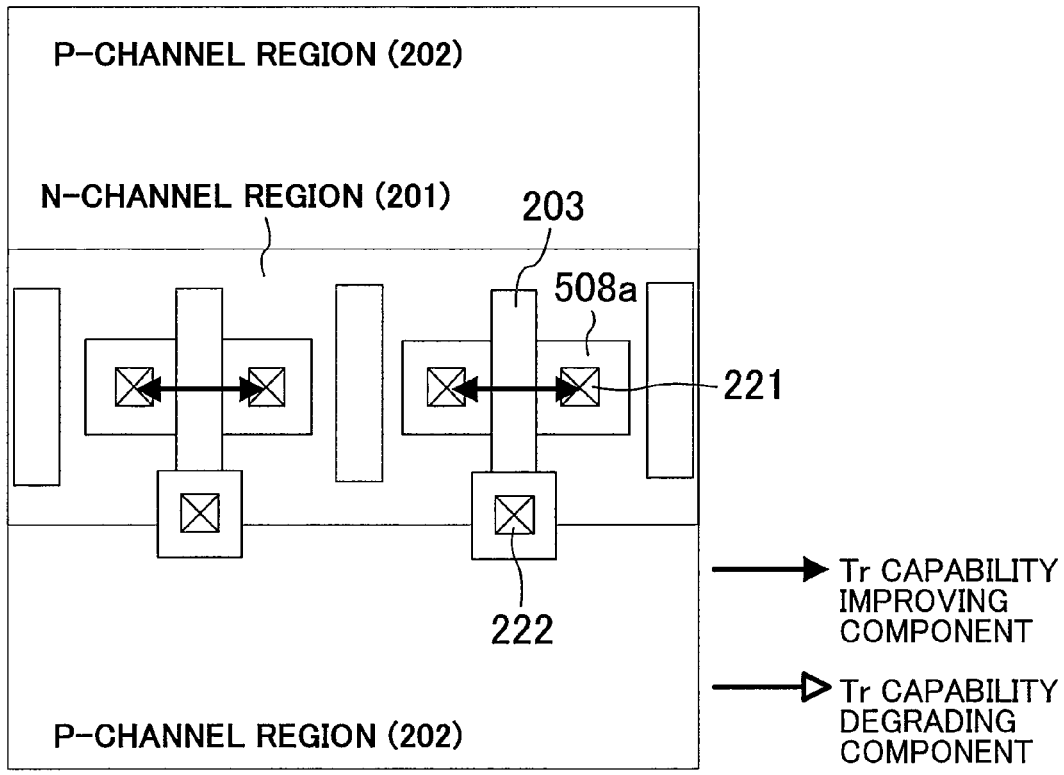
Figure 8A:
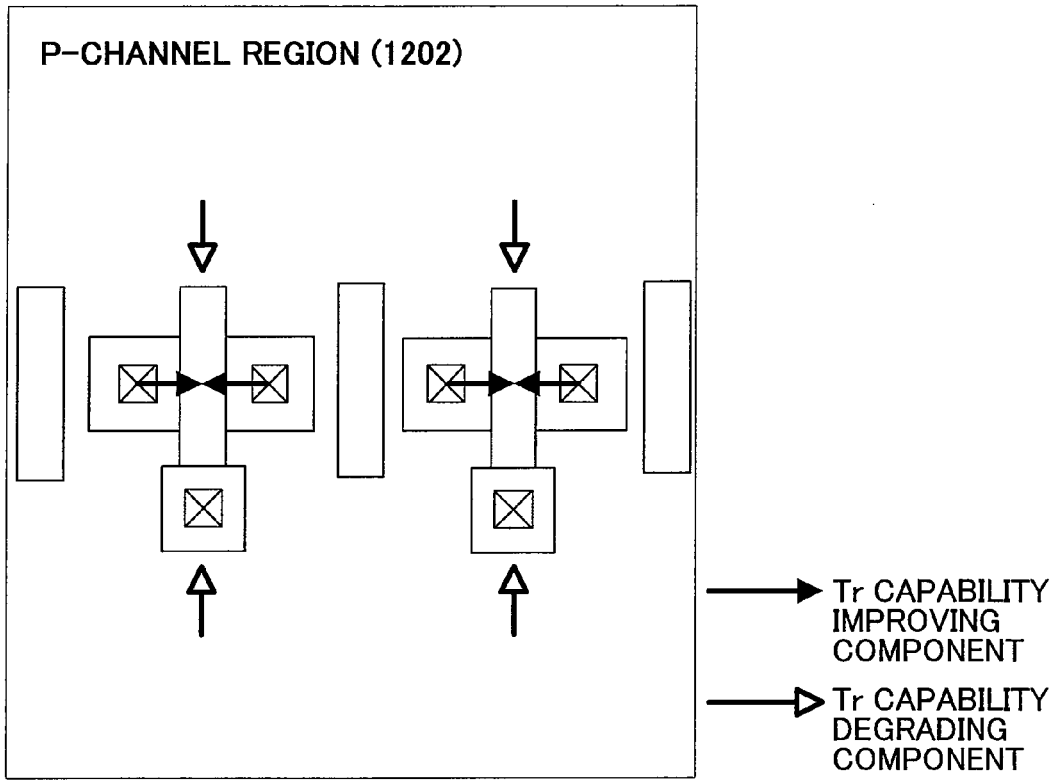
FIGS. 8A and 8B are plan views showing a layout example of a P-channel region in the conventional semiconductor device and the semiconductor device of the embodiment of the present invention, respectively.
Figure 8B:
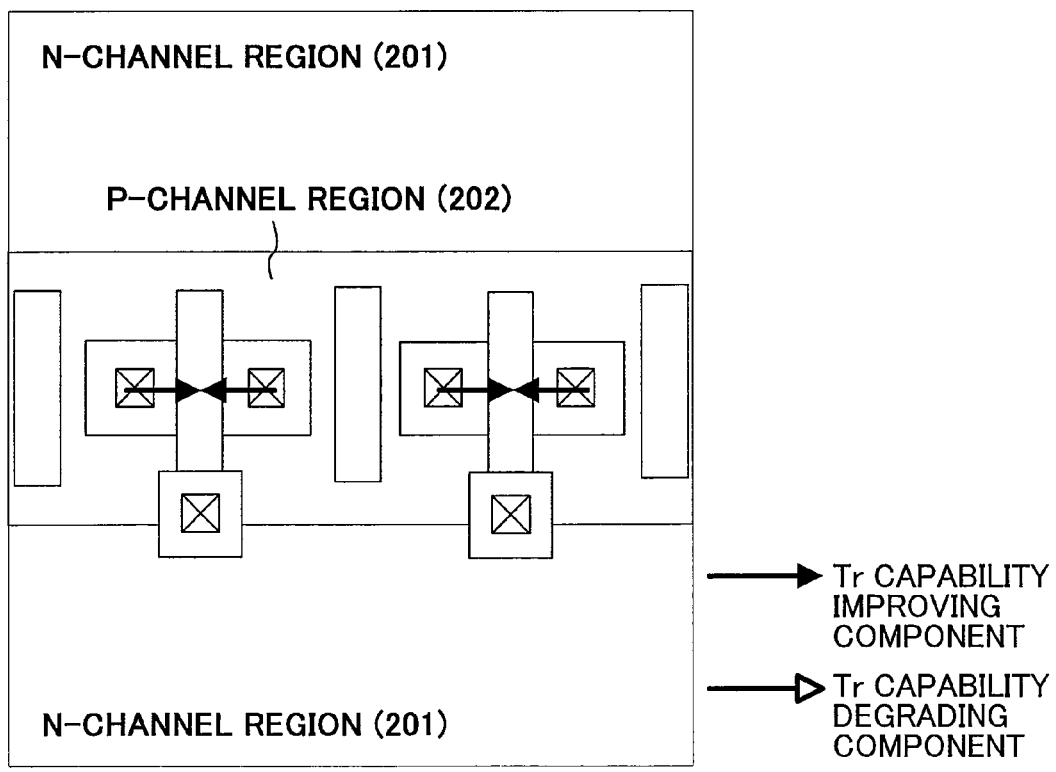
Figure 9:
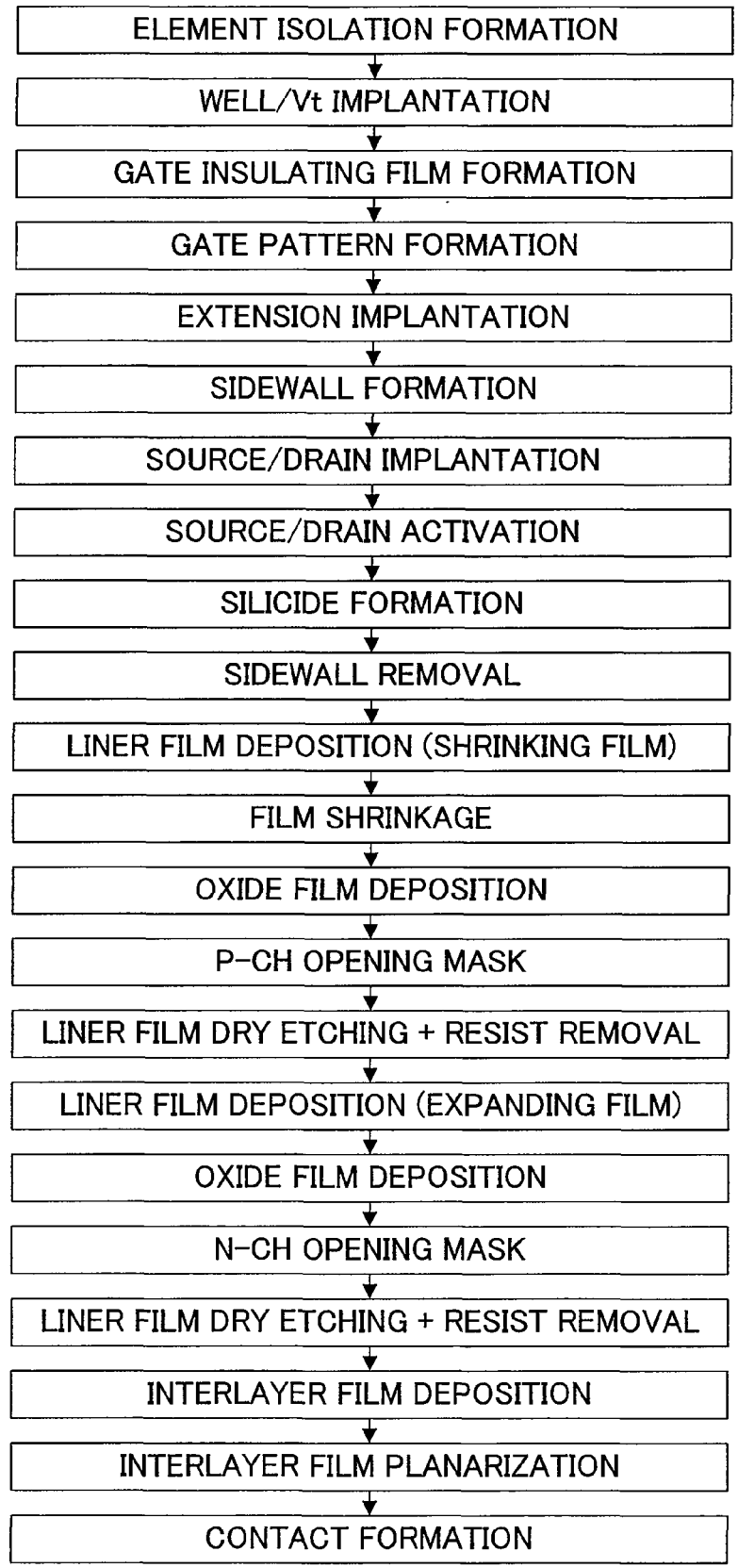
FIG. 9 shows a process flow in a conventional DSL technology.
Figure 10A:
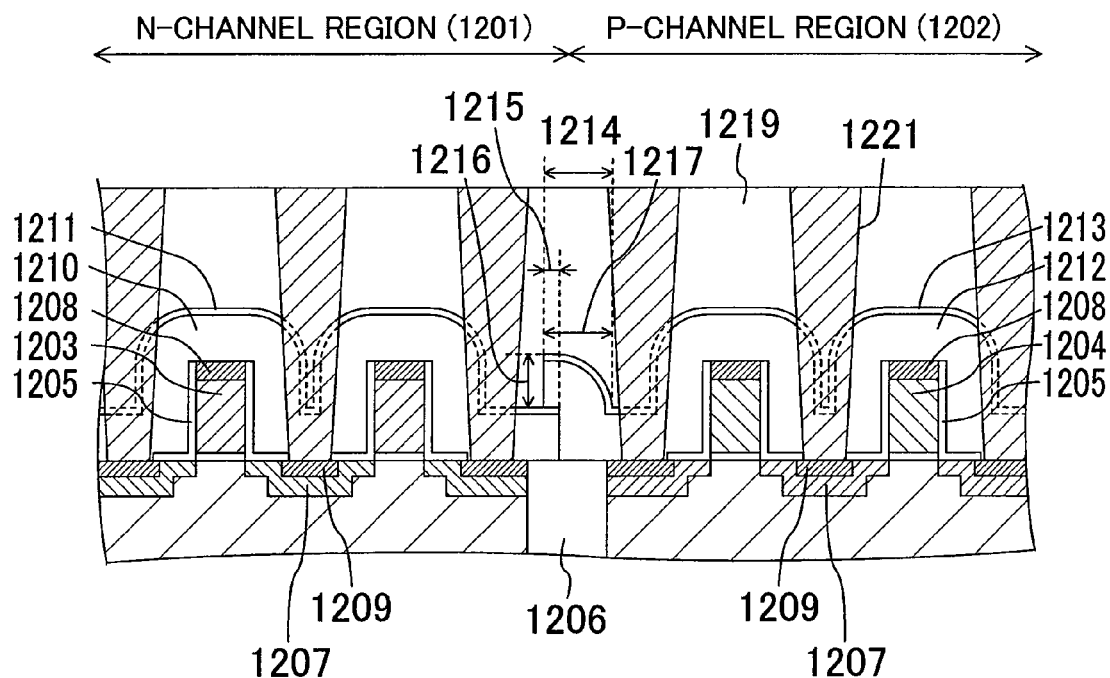
FIG. 10A is a cross-sectional view in the gate length direction of an example of a conventional semiconductor device.
Figure 10B:
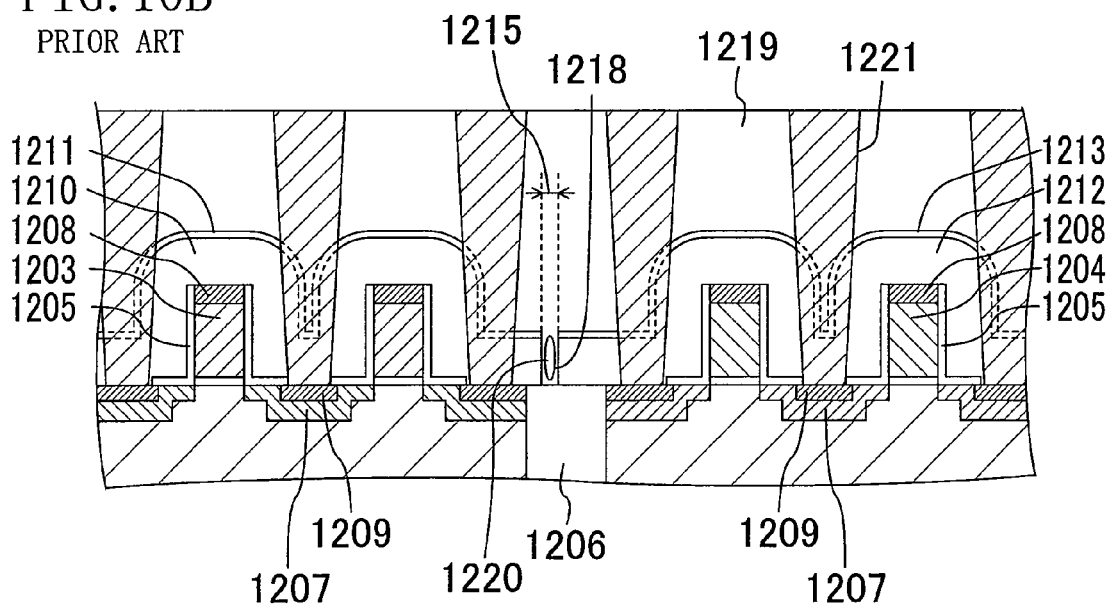
FIG. 10B is a cross-sectional view in the gate length direction in another example of a conventional semiconductor device.

FIGS. 7A and 7B are plan views respectively showing a layout example of the N-channel regions 1201, 201 in the conventional semiconductor device and the semiconductor device of the present embodiment. FIGS. 8A and 8B are plan views respectively showing a layout example of the P-channel regions 1202, 202 in the conventional semiconductor device and the semiconductor device of the present embodiment.

As shown in FIG. 7A, in the case where the channel direction is a <100> direction, the n-channel field effect transistor is somewhat affected by a tensile stress that is applied to the channel in the gate width direction. In this case, as shown in FIG. 7B, the shrinkage force of the contact liner film near the gate electrode end of the N-channel region 201 can be reduced by arranging the P-channel region 202 in parallel with the gate length direction of the N-channel region 201 (adjacent to the N-channel region 201 in the gate width direction). The mobility of the n-channel field effect transistor can thus be improved without being affected by the stress in the gate width direction.

As shown in FIG. 8A, in the case where the channel direction is a <110> direction, the p-channel field effect transistor is somewhat affected by a tensile stress that is applied to the channel in the gate length direction. In this case, as shown in FIG. 8B, the expansion force of the contact liner film near the end of the P-channel region 202 can be reduced by arranging the N-channel region 201 in parallel with the gate length direction of the P-channel region 202 (adjacent to the P-channel region 202 in the gate width direction). The mobility of the p-channel field effect transistor can thus be improved without being affected by the stress in the gate length direction.

The n-channel contact liner 518 and the p-channel contact liner 519 are continuously formed in the np boundary region 517. The difference in level 216 between the top surface of the n-channel contact liner 518 and the top surface of the p-channel contact liner 519 is, for example, about 3 nm to about 15 nm.

As shown in the example of FIG. 5C, a contact liner 513 made of silicon nitride may be formed between the Ni silicide layers 511, 512, the sidewall lower layer film 506 and the element isolation region 206 and the n-channel contact liner 518 and the p-channel contact liner 519 so as to extend over the N-channel region 201 and the P-channel region 202. In this case, the composition of the contact liner 513 is almost the same both in the N-channel region 201 and the P-channel region 202, and the density of Si—N bonds in the contact liner 513 is higher than that in the n-channel contact liner 518 and in the p-channel contact liner 519.

The n-channel contact liner 518 and the p-channel contact liner 519 are formed by implanting different ion species to the contact liner 513 formed in the same step. The width of the np boundary region 517 is therefore reduced as compared to the conventional semiconductor device, whereby generation of voids and slits is suppressed.

Note that the ion implantation and the subsequent heat treatment causes shrinkage of the n-channel contact liner 518 and expansion of the p-channel contact liner 519. The density of Si—N bonds in the film is therefore higher in the n-channel contact liner 518 than in the p-channel contact liner 519.

Note that the n-channel contact liner 518 and the p-channel contact liner 519 are formed by the same film. Accordingly, the contact liner film is not separated by etching or the like and does not have any seam. The area dependency of the contact liner film is therefore reduced, and unintended variation in transistor characteristics is smaller than that in the conventional semiconductor device.

As has been described above, the present invention is useful to improve the yield of semiconductor devices having an n-channel transistor and a p-channel transistor in the same chip and having many np boundaries, such as an SRAM.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

What is claimed is:

1. A semiconductor device, comprising:
    a semiconductor substrate;
    an element isolation region for electrically isolating a first active region in an N-channel region from a second active region in a P-channel region in the semiconductor substrate;
    an n-channel field effect transistor having an n-channel gate formed on the first active region with a gate insulating film interposed therebetween and a first source/drain region formed on both sides of the n-channel gate in the first active region;
    a p-channel field effect transistor having a p-channel gate formed on the second active region with a gate insulating film interposed therebetween and a second source/drain region formed on both sides of the p-channel gate in the second active region;
    an n-channel contact liner formed over the first active region and side surfaces and a top surface of the n-channel gate and having a shrinkage force;
    a p-channel contact liner formed over the second active region and side surfaces and a top surface of the p-channel gate, formed continuously with the n-channel contact liner so as to have a larger thickness than that of the n-channel contact liner, and having an expansion force; and
    a contact liner formed between the first active region and n-channel field effect transistor and the n-channel contact liner and between the second active region and p-channel field effect transistor and the p-channel contact liner, wherein:
    the n-channel contact liner and the p-channel contact liner are made of a same base material and contain different impurity atoms from each other, and
    the contact liner is made of the same base material as that of the n-channel contact liner and the p-channel contact liner and has a smaller density of the impurity atoms than that of the impurity atoms in the n-channel contact liner and the p-channel contact liner.

2. The semiconductor device according to claim 1, wherein the base material of the n-channel contact liner and the p-channel contact liner is silicon nitride and a density of Si—N bonds in the n-channel contact liner is higher than that of Si—N bonds in the p-channel contact liner.

3. The semiconductor device according to claim 1, wherein the n-channel contact liner contains carbon or fluorine as the impurity atoms.

4. The semiconductor device according to claim 1, wherein the p-channel contact liner contains oxygen as the impurity atoms.

5. The semiconductor device according to claim 1, wherein the n-channel contact liner and the p-channel contact liner contain an element having an ionic radius equal to or larger than that of silicon at a higher concentration than that in the contact liner.

6. The semiconductor device according to claim 5, wherein the n-channel contact liner and the p-channel contact liner contain silicon, arsenic, indium, or germanium at a higher concentration than that in the contact liner.

7. The semiconductor device according to claim 1, wherein the p-channel contact liner contains Ge at a higher density than that in the n-channel contact liner.

8. The semiconductor device according to claim 1, wherein a density of Si—H bonds in the n-channel contact liner and the p-channel contact liner is higher than that of Si—H bonds in the contact liner.

9. The semiconductor device according to claim 1, wherein a difference in level between the n-channel contact liner and the p-channel contact liner in a boundary region between the N-channel region and the P-channel region is 3 nm to 15 nm.

10. A semiconductor device, comprising:
    a semiconductor substrate;
    an element isolation region for electrically isolating a first active region in an N-channel region from a second active region in a P-channel region in the semiconductor substrate;
    an n-channel field effect transistor having an n-channel gate formed on the first active region with a gate insulating film interposed therebetween and a first source/drain region formed on both sides of the n-channel gate in the first active region;
    a p-channel field effect transistor having a p-channel gate formed on the second active region with a gate insulating film interposed therebetween and a second source/drain region formed on both sides of the p-channel gate in the second active region;
    an n-channel contact liner formed over the first active region and side surfaces and a top surface of the n-channel gate and having a shrinkage force;
    a p-channel contact liner formed over the second active region and side surfaces and a top surface of the p-channel gate-and having an expansion force; and
    a boundary region formed between the n-channel contact liner and the p-channel contact liner, wherein
    the p-channel contact liner has a larger thickness than that of the n-channel contact liner, and
    the n-channel contact liner, the p-channel contact liner and the boundary region are formed continuously.

11. The semiconductor device according to claim 10, wherein the n-channel contact liner and the p-channel contact liner are made of a same base material and contain different impurity atoms from each other.

12. The semiconductor device according to claim 11, further comprising a contact liner formed between the first active region and n-channel field effect transistor and the n-channel contact liner and between the second active region and p-channel field effect transistor and the p-channel contact liner, wherein the contact liner is made of the same base material as that of the n-channel contact liner and the p-channel contact liner and has a smaller density of the impurity atoms than that of the impurity atoms in the n-channel contact liner and the p-channel contact liner.

13. The semiconductor device according to claim 12, wherein the n-channel contact liner and the p-channel contact liner contain an element having an ionic radius equal to or larger than that of silicon at a higher concentration than that in the contact liner.

14. The semiconductor device according to claim 13, wherein the n-channel contact liner and the p-channel contact liner contain silicon, arsenic, indium, or germanium at a higher concentration than that in the contact liner.

15. The semiconductor device according to claim 12, wherein a density of Si—H bonds in the n-channel contact liner and the p-channel contact liner is higher than that of Si—H bonds in the contact liner.

16. The semiconductor device according to claim 10, wherein a base material of the n-channel contact liner and the p-channel contact liner is silicon nitride and a density of Si—N bonds in the n-channel contact liner is higher than that of Si—N bonds in the p-channel contact liner.

17. The semiconductor device according to claim 10, wherein the n-channel contact liner contains carbon or fluorine as impurity atoms.

18. The semiconductor device according to claim 10, wherein the p-channel contact liner contains oxygen as impurity atoms.

19. The semiconductor device according to claim 10, wherein the p-channel contact liner contains Ge at a higher density than that in the n-channel contact liner.

20. The semiconductor device according to claim 10, wherein a difference in level between the n-channel contact liner and the p-channel contact liner in a boundary region between the N-channel region and the P-channel region is 3 nm to 15 nm.

* * * * *